(12) United States Patent
Gawrys et al.

(10) Patent No.: US 10,854,007 B2
(45) Date of Patent: Dec. 1, 2020

(54) SPACE MODELS FOR MIXED REALITY

(71) Applicant: Microsoft Technology Licensing, LLC, Redmond, WA (US)

(72) Inventors: Stefan Krzysztof Gawrys, Seattle, WA (US); Patrick James Gorman, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/208,405

(22) Filed: Dec. 3, 2018

(65) Prior Publication Data

US 2020/0175766 A1 Jun. 4, 2020

(51) Int. Cl.
*G06T 19/00* (2011.01)
*G06T 17/00* (2006.01)
*G06F 16/901* (2019.01)
*G06F 16/907* (2019.01)

(52) U.S. Cl.
CPC .......... *G06T 19/006* (2013.01); *G06F 16/907* (2019.01); *G06F 16/9027* (2019.01); *G06T 17/00* (2013.01)

(58) Field of Classification Search
CPC ............................ G06T 19/006; G06F 16/907
USPC ........................................................ 345/633
See application file for complete search history.

(56) References Cited

U.S. PATENT DOCUMENTS

| 6,690,393 | B2 * | 2/2004 | Heron | G06T 19/00 715/757 |
| 7,308,139 | B2 * | 12/2007 | Wentland | G01V 1/34 382/181 |
| 9,536,355 | B1 | 1/2017 | Kumar et al. | |
| 9,779,553 | B2 * | 10/2017 | Byrne | G06T 15/503 |
| 2007/0216675 | A1 * | 9/2007 | Sun | G06T 11/00 345/419 |

(Continued)

FOREIGN PATENT DOCUMENTS

WO 2017142793 A1 8/2017

OTHER PUBLICATIONS

"Augmented reality in-situ 3D model menu for outdoors" Thuong N. Hoang; Bruce H. Thomas 2008 7th IEEE/ACM International Symposium on Mixed and Augmented Reality Year: 2008.*

(Continued)

*Primary Examiner* — Javid A Amini

(57) ABSTRACT

Embodiments relate to supplementing a mixed reality system with information from a space model. The space model is a hierarchical or tree model of a physical space, where nodes represent physical places in the physical space and a parent-child relationship between nodes in the tree indicates a physical containment relationship for physical places represented by the nodes. The space model models containment relationships (e.g., building-floor-room) and does not necessarily include a two or three dimensional map of the physical place. Some of the nodes of the space model include representations of sensors and store measures therefrom. The mixed reality system includes a three-dimensional model possibly modeling part of the physical space. The mixed reality system renders views of the three-dimensional model according to the sensor measures stored in the representations.

20 Claims, 11 Drawing Sheets

(56) References Cited

U.S. PATENT DOCUMENTS

| | | | |
|---|---|---|---|
| 2008/0307307 A1* | 12/2008 | Ciudad | G06T 13/80 715/719 |
| 2008/0310707 A1* | 12/2008 | Kansal | G06T 19/006 382/154 |
| 2009/0144137 A1* | 6/2009 | Moulton | G06Q 30/00 705/14.73 |
| 2012/0203067 A1* | 8/2012 | Higgins | A61B 1/00006 600/117 |
| 2012/0290950 A1* | 11/2012 | Rapaport | H04L 51/32 715/753 |
| 2013/0093790 A1* | 4/2013 | Jin | G06F 16/907 345/633 |
| 2013/0127980 A1* | 5/2013 | Haddick | G06F 3/013 348/14.08 |
| 2015/0294506 A1 | 10/2015 | Bare et al. | |
| 2015/0302642 A1* | 10/2015 | Miller | G06F 3/011 345/633 |
| 2016/0026253 A1* | 1/2016 | Bradski | G02B 27/0172 345/8 |
| 2016/0171767 A1* | 6/2016 | Anderson | G06F 3/011 345/633 |
| 2016/0236088 A1* | 8/2016 | Li | A63F 13/00 |
| 2017/0039774 A1* | 2/2017 | Estable | G02B 27/017 |
| 2017/0061693 A1* | 3/2017 | Kohler | G06T 19/006 |
| 2017/0061694 A1* | 3/2017 | Giraldi | G06T 19/006 |
| 2017/0236332 A1* | 8/2017 | Kipman | G02B 27/0172 345/633 |
| 2017/0270711 A1* | 9/2017 | Schoenberg | G02B 27/017 |
| 2017/0345215 A1* | 11/2017 | Khedkar | G06F 3/012 |
| 2018/0165978 A1 | 6/2018 | Wood et al. | |
| 2018/0196522 A1 | 7/2018 | Rochford et al. | |
| 2018/0284736 A1 | 10/2018 | Cella et al. | |
| 2018/0286130 A1* | 10/2018 | Lee | G06T 7/194 |
| 2019/0279417 A1* | 9/2019 | Castaneda | G06T 15/20 |
| 2020/0020166 A1* | 1/2020 | Menard | G06T 13/20 |

OTHER PUBLICATIONS

"IWorlds: Building Mixed Reality Intelligent Environments using Customisable 3D Virtual Worlds" Marc Davies, Vic Callaghan, 2010 Sixth International Conference on Intelligent Environments.*

"Integrating procedural generation and manual editing of virtual worlds" Ruben Smelik et al., 2010 ACM.*

Belimpasakis, et al., "A Combined Mixed Reality and Networked Home Approach to Improving User Interaction with Consumer Electronics", In Journal of IEEE Transactions on Consumer Electronics, vol. 57, Issue 1, Feb. 21, 2011, pp. 139-144.

Jeong, et al., "AVIoT: Web-Based Interactive Authoring and Visualization of Indoor Internet of Things", In Journal of IEEE Transactions on Consumer Electronics, vol. 61, Issue 3, Aug. 2015, pp. 295-301.

"International Search Report and Written Opinion Issued in PCT Application No. PCT/US19/063123", dated Mar. 26, 2020, 13 Pages.

Pfisterer, et al., "Spitfire: Toward a Semantic Web of Things", In Journal of IEEE Communications Magazine, vol. 49, Issue 11, Nov. 10, 2011, pp. 40-48.

Reitmayr, et al., "Semantic World Models for Ubiquitous Augmented Reality", In Proceedings of the Workshop towards Semantic Virtual Environments (SVE), Mar. 16, 2005, 10 Pages.

* cited by examiner

SPACE MODELS FOR MIXED REALITY

BACKGROUND

Recent advances in cloud technology and Internet of Thing (IoT) hardware and software has led to a need for modeling of physical places or spaces. This has led cloud providers to develop complex space modeling tools for cloud tenants to use to model physical spaces. A tenant may author a space model that models a physical space. The space model then facilitates integration with IoT devices with a cloud and synthesis of IoT data. The space model may be executed and managed by the cloud and may have interfaces or facilities for communicating with IoT devices. The space model may model the locations of IoT devices within the corresponding physical space.

Previously, such space modeling techniques have been used for managing and organizing information about the physical space, synthesizing metadata about the physical space, providing the information about the space to other systems, etc. Generally, space models have only been considered useful for modeling physical spaces and supporting operations directed to the physical space, building facilities, or the like. It has not previously been appreciated that space models can be used to supplement mixed reality or augmented reality systems. That is, the inventors are the first to appreciate that tools for modeling physical spaces can be used for supplementing the state of mixed/augmented reality systems such that the graphics displayed by such systems reflect modeled state of the physical space.

Techniques related to supplementing augmented/mixed reality systems with metadata from space models are discussed below.

SUMMARY

The following summary is included only to introduce some concepts discussed in the Detailed Description below. This summary is not comprehensive and is not intended to delineate the scope of the claimed subject matter, which is set forth by the claims presented at the end.

Embodiments relate to supplementing a mixed reality system with information from a space model. The space model is a hierarchical or tree model of a physical space, where nodes represent physical places in the physical space and a parent-child relationship between nodes in the tree indicates a physical containment relationship for physical places represented by the nodes. The space model models containment relationships (e.g., building-floor-room) and does not necessarily include a two- or three-dimensional map of the physical place. Some of the nodes of the space model include representations of sensors and store measures therefrom. The mixed reality system includes a three-dimensional model possibly modeling part of the physical space. The mixed reality system renders views of the three-dimensional model according to the sensor measures stored in the representations.

Many of the attendant features will be explained below with reference to the following detailed description considered in connection with the accompanying drawings.

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Figure 1:
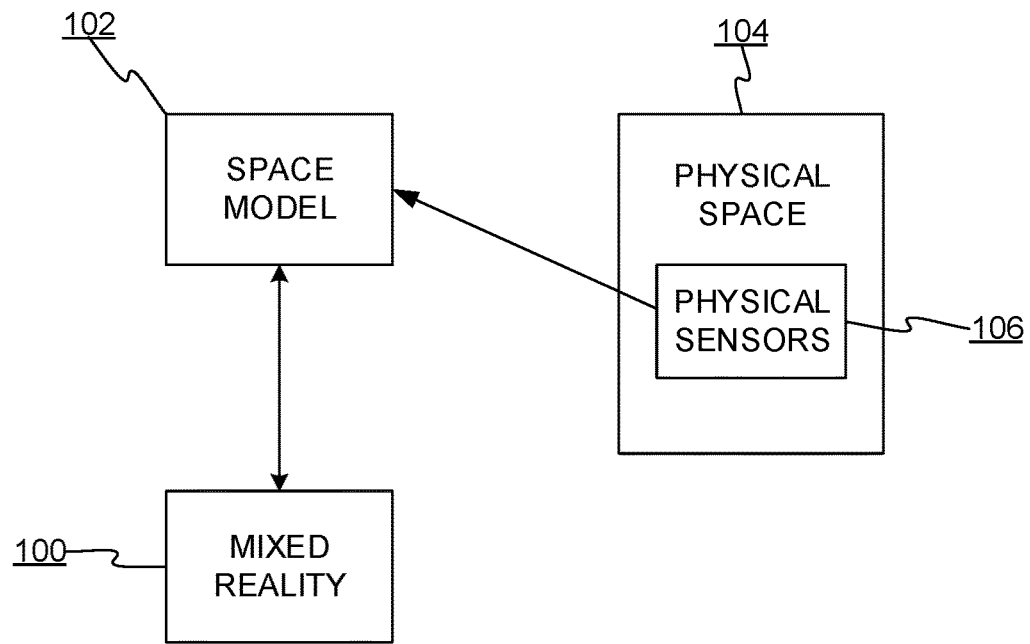
FIG. 1 shows a mixed reality system cooperating with a space model to display information from the space model.
Figure 1:
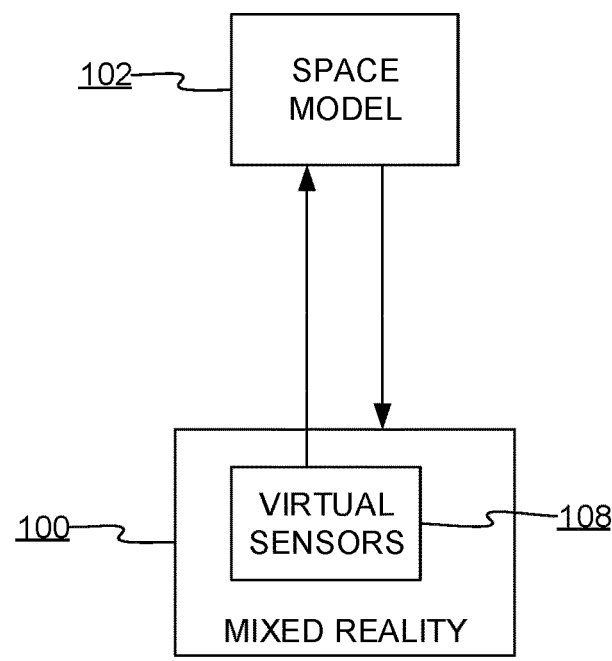

FIG. 1 shows a mixed reality system 100 cooperating with a space model 102 to display information from the space model 100. In the upper half of FIG. 1, the space model 102 models a physical space 104 that is equipped with physical sensors 106. The space model 102 models features of a physical space 104, although there the space model 102 need not correspond to an actual physical space. In the embodiment shown in the upper half of FIG. 1, the physical space 104 includes physical sensors 106. The physical sensors 106 measure aspects of their local physical space such as temperature, motion detection, sensed sound, light, etc. The sensors pass their measurements to the space model 102 via a communication pathway which may involve a local IoT device such as a hub or edge device, which in turn passes measurements to a cloud which then provides the measurements to the space model 102.

The mixed reality system 100 includes a model of its own three-dimensional space, components for rendering graphics that correspond to current state of the three-dimensional model, an input device operated by a user, a display device, and other known components. Generally, the mixed reality system 100 renders graphics in synchronization with spatial-locational information of a display, perhaps allowing the rendered graphics to be anchored and aligned with physical surroundings. Information from the space model 102 flows to the mixed reality system 100 (e.g. by queries or model-generated events), thus allowing the mixed reality system 100 to render its graphics to reflect state of the space model 102, and, if the space model 102 corresponds to the physical space 104, the rendering may correspond to state (and location) of the physical space 104 as reflected in the sensor data captured by the space model 102. The mixed reality system 100 is described in more detail with reference to FIGS. 6-8.

The lower half of FIG. 1 shows another embodiment where virtual sensors 108 embedded in the mixed reality system 100 provide virtual sensor readings to the space model 102. The virtual sensors 108 are located in the three-dimensional space/model managed by the mixed reality 100. The virtual sensors 108 report events or readings to the space model 102. Other than being virtual, the virtual sensors 108 interact with the space model 102 in the same way as the physical sensors 106, and the space model 102 manages the inputs from the virtual sensors 108 in much the same way. The main difference between the two scenarios is that the virtual sensors 108 are part of the mixed reality 100. In the case of interactive virtual sensors (e.g., virtual buttons), this embodiment enables scenarios where a sensor can be rendered in mixed reality graphics output, the sensor can be interacted by a user to provide input from the mixed reality system 100 to the space model 102, the space model's state is changed accordingly, the space model provides information about its state to the mixed reality system 100 (information that is perhaps specific to a user location in the mixed reality system's 3D/virtual space), and the mixed reality system 100 renders its graphics to reflect the state of the space model 102 as influenced by the virtual sensors 108 in the mixed reality system 100.

Figure 2:
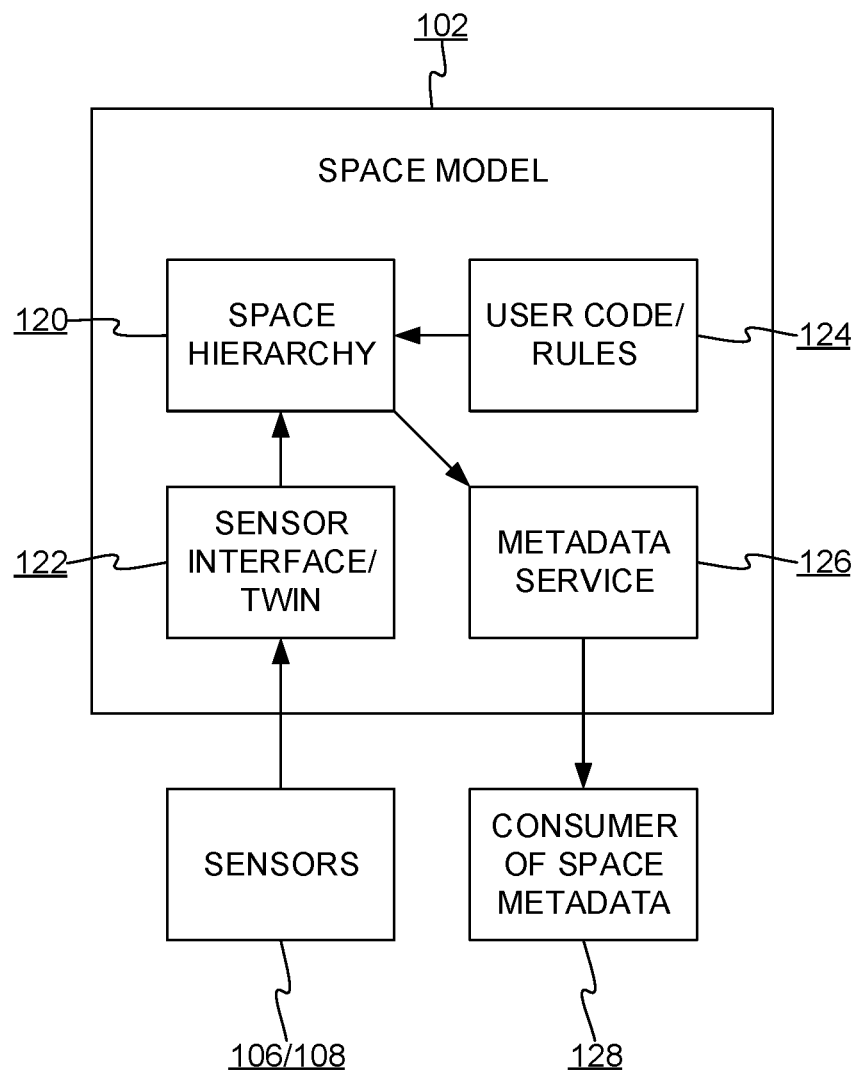
FIG. 2 shows an overview of components of a space model.

FIG. 2 shows an overview of components of a space model 102. The space model 102 may be provided by a cloud service. Users or tenants author the space model 102 using various cloud tools, and the space model 102 is then stored and implemented by the cloud. The salient feature of the space model 102 is the space hierarchy 120. The space hierarchy 120 is a tree or graph that models the relationships between space elements such as buildings, floors rooms, for example. The space hierarchy 120 reflects the relationships between place/location elements, but without concern for two-dimensional or three-dimensional locations. In short, the space hierarchy 120 is a relationship graph, not a map. The space hierarchy 120 is described in detail with reference to FIG. 3.

The space model 102 also includes sensor interfaces 122. A sensor interface 122 is generated for each physical/virtual sensor 106/108 ("sensor" hereafter). The sensor interfaces 122 mirror state of the respective sensors, store and possibly translate measures from the sensors, and provide the sensor state and readings to the space hierarchy 120. The sensor interfaces 122 may be associated with or contained by elements of the space hierarchy 120, thus locating them within the hierarchy. When a sensor 106/108 is added to the space model 102, a corresponding sensor interface 122 (or digital representation) is added to an element in the space hierarchy 120. In short, each interface 122 takes in measures or inputs from a corresponding sensor and introduces the measures or inputs to the space hierarchy 120, preferably in association with a particular node in the space hierarchy that corresponds to an intended relational location of the sensor.

The space model 102 further includes user code 124 (or rules). The user code 124 specifies behaviors or actions taken based on state of the space hierarchy 120. A rule or piece of code is inputted by a user in association with a user-specified element of the space hierarchy. The code may be triggered by updates to the relevant hierarchy element or subtrees or elements contained by the element, or the code may monitor the state of its element. In either case, the code evaluates the state of its element and depending thereon may take some action such as generating an event, updating state of the space hierarchy 120, communicating with the cloud, and so forth.

Finally, the space model 102 includes a metadata service 126. The metadata service 126 provides metadata of the space hierarchy 120 to any client or metadata consumer 128. The metadata service 126 may implement a publish/subscribe model, and/or a query service. In the publish/subscribe case, a consumer 128 subscribes to the space hierarchy 120 or elements thereof, possibly with a filter or other means to specify particular parts of the space hierarchy 120. In the query case, a consumer 128 submits metadata queries to the metadata service 126, which searches the space hierarchy 120 for the metadata described in the query and returns the metadata to the consumer 128. The metadata service 126 may perform other functions such as . . . .

Figure 3:
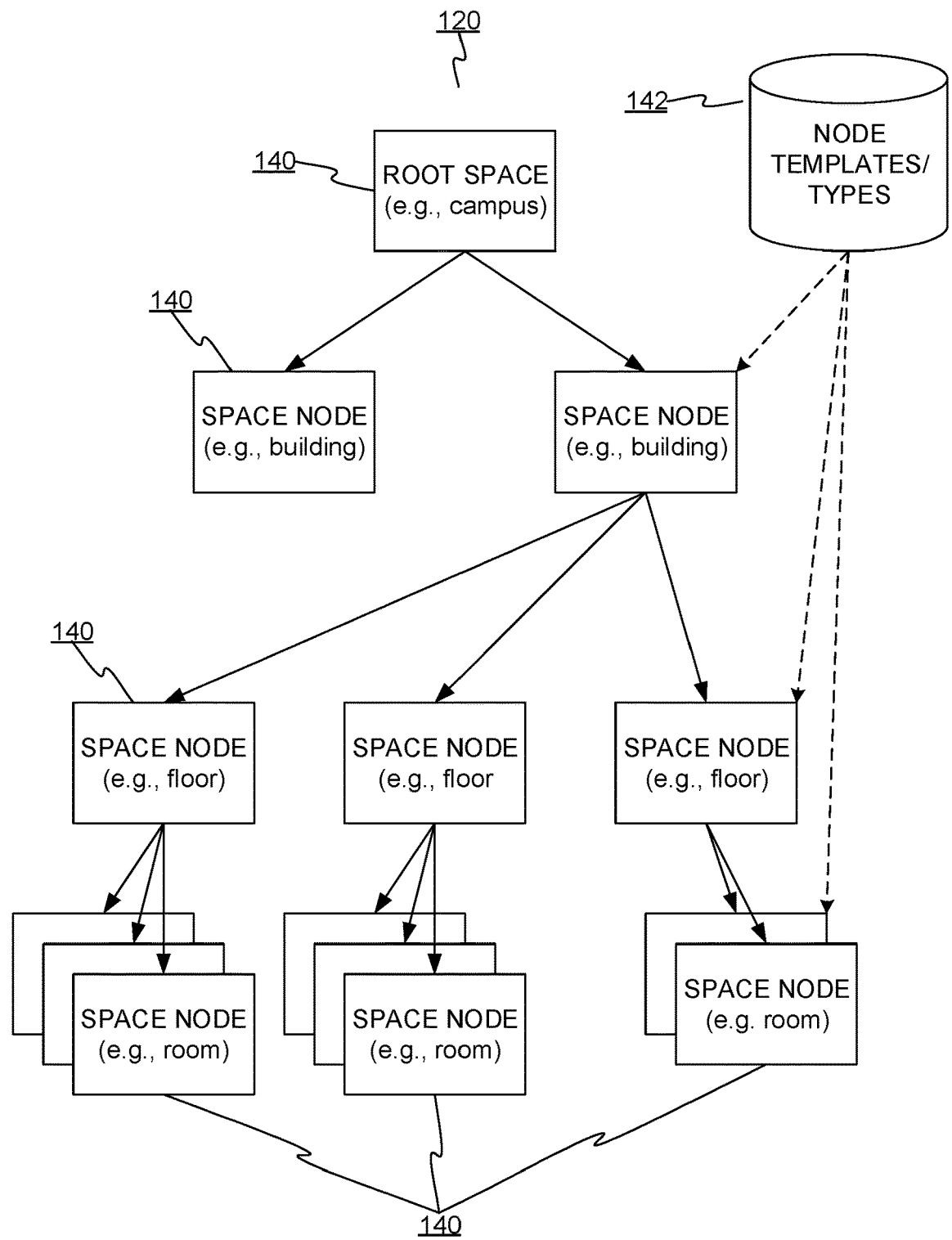
FIG. 3 shows details of a space hierarchy.

FIG. 3 shows details of a space hierarchy 120. As noted above, the space hierarchy is a data structure that models the containment relationships of places or structures, where nodes 140 represent places or structures. Techniques for implementing a tree data structure are well known and described elsewhere. Nodes 140 may be set to have types predefined in a template database 142, for instance a street block or campus, building, floor, room, etc. The template database may also include preconfigured space hierarchies, for instance basic building templates. Each type of node may have metadata fields common to all nodes as well as metadata fields specific to the type of node. Furthermore, some nodes may have metadata fields whose values depend on the values of the same metadata fields of child nodes. For example, if several leaf nodes (e.g., rooms) are contained by a same parent node (e.g., a floor), the parent node will have a temperature metadata value that is an aggregation of its child nodes (or subtrees, as the case may be). In other words, some metadata values for nodes may be a synthesis or sum of the values in the nodes it contains.

In the case of virtual sensors linked to the space hierarchy 120, some virtual sensors may be interactive, i.e., activatable by a user of the mixed reality system 100. Such input may set a value of a metadata field in a space node through a corresponding sensor interface attached to the corresponding space node. The input from the virtual sensor may influence the state of the space hierarchy, which in turn may trigger events to be outputted by the metadata service or certain values to be returned by queries to the metadata service.

Figure 4:
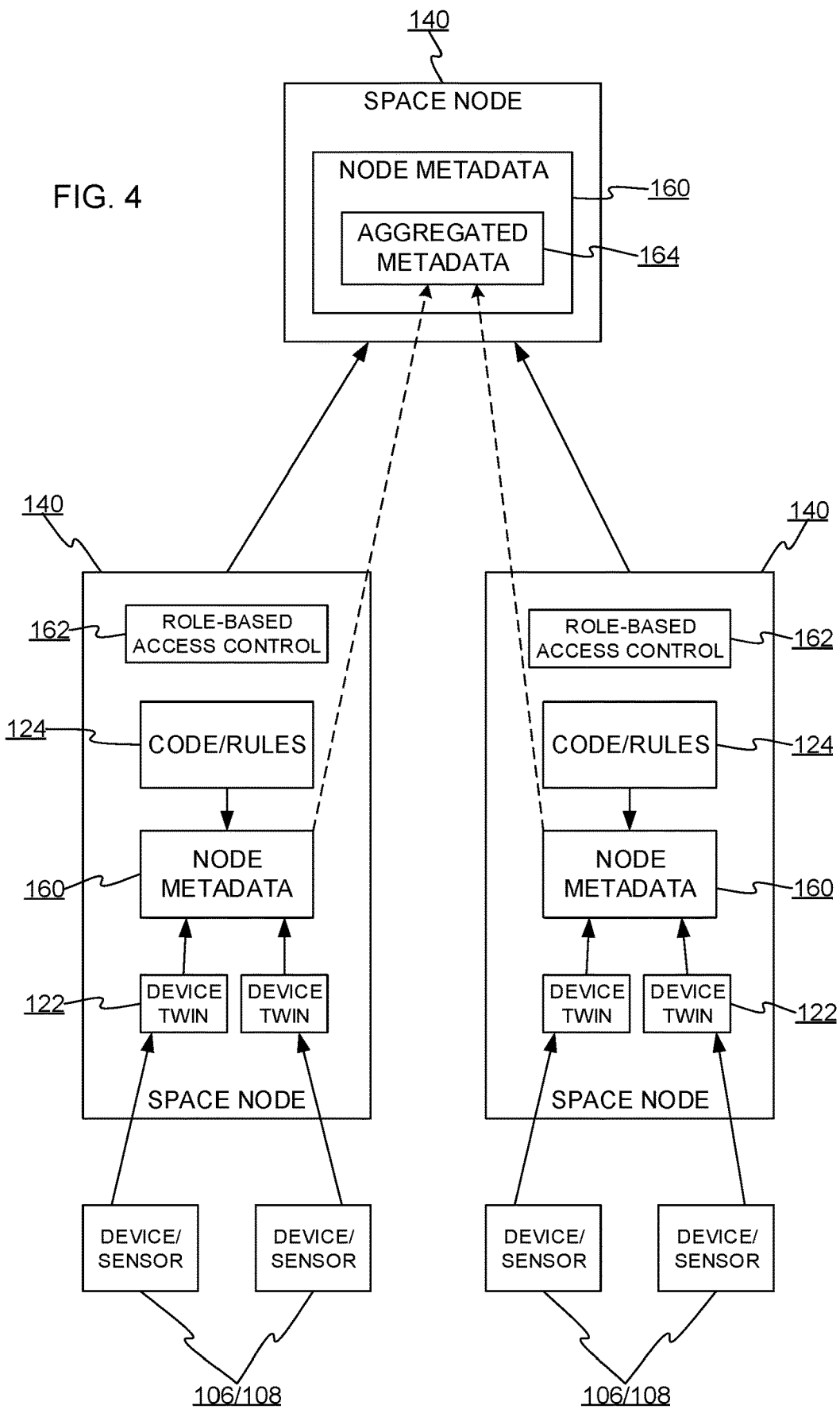
FIG. 4 shows details of space nodes in a space hierarchy.

FIG. 4 shows details of space nodes 140 in a space hierarchy 120. As noted above, each node may have node metadata 160, which may include user-defined fields and predefined fields per the typing of a node. Some metadata fields may be populated by or linked to device or sensor interfaces 122. As also noted above, a node may contain user-authored code or rules keyed to the metadata of the hosting node (and/or other nodes). The code or rule may specify conditions of metadata parameters and actions to be taken, such as modifying a metadata field, generating an event, communicating with a cloud service, and the like. The nodes may also have modules for role-based access control 162. For instance, access control lists may be used to determine who is allowed to read or modify metadata or load code into a node for execution. The access control mechanism may also be used to control who can add a device representation (sensor interface), what types of interfaces can be added, etc.

As noted above, a node's metadata may have aggregated metadata 164 values (perhaps implicit) that is a product of the same metadata field instances in the contained nodes. The aggregated metadata 164 may also have aggregation rules to define how values below are aggregated. For example, if there is a Boolean metadata field (e.g., "occupied" or "person present"), a value of "true" or "false" is straightforward for leaf nodes. Parent nodes containing nodes with such fields may need a rule to determine how the metadata field is to be determined. Referring to the "occupied" example, a container node may set its "occupied" field to "true" if a certain number of the fields in its child nodes are true. Similarly, for temperature, a "floor" node might set its "temperature" field to an average of the temperatures of its child nodes.

Figure 5:
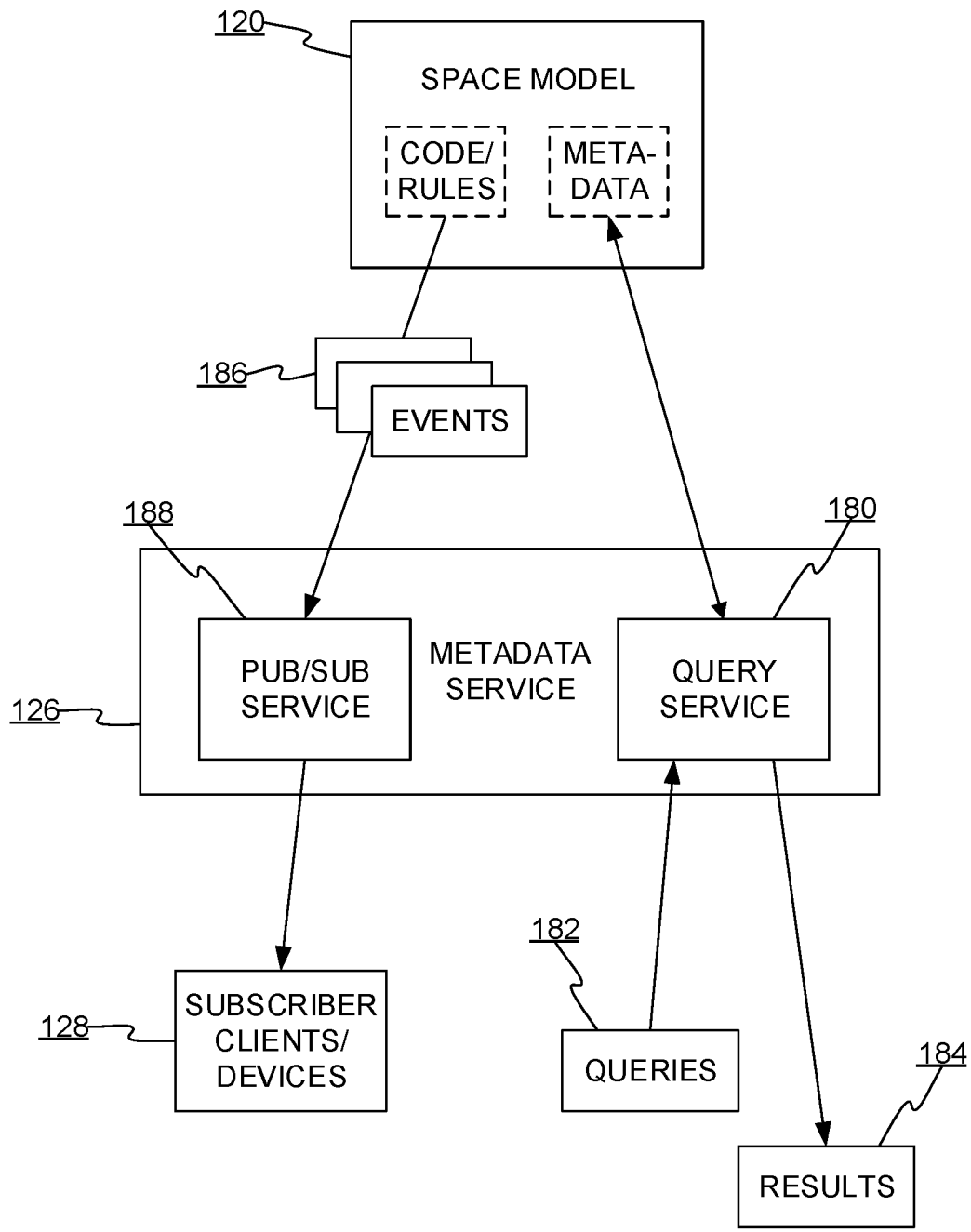
FIG. 5 shows a metadata service providing data about the space model to clients or devices communicating with the metadata service.

FIG. 5 shows the metadata service 126 providing data about the space model 120 to clients or devices communicating with the metadata service 126. In a query-based embodiment, the metadata service 126 includes a query service 180. The query service 180 receives metadata queries 182 specifying combinations of parameters such as a particular node (place), a type of node, a represented sensor or device, a type of metadata, and/or a node having a specified feature or containing a specified item, etc. The query service 180 parses through the space model 120 to find the specified metadata, and a corresponding result 184 is returned to the requestor (e.g., a mixed reality system). In a publish/subscribe model, a subscriber (e.g., a mixed reality system) submits a subscription request specifying events desired to be received. The request may include parameters similar to those of a query, but to filter which events are received. Consequently, the subscriber receives an event when code running in the space model generates an event and the event meets the subscriber's requirements. Queries and event filters may specify, for example, whichever node contains a particular mobile object or user.

Figure 6:
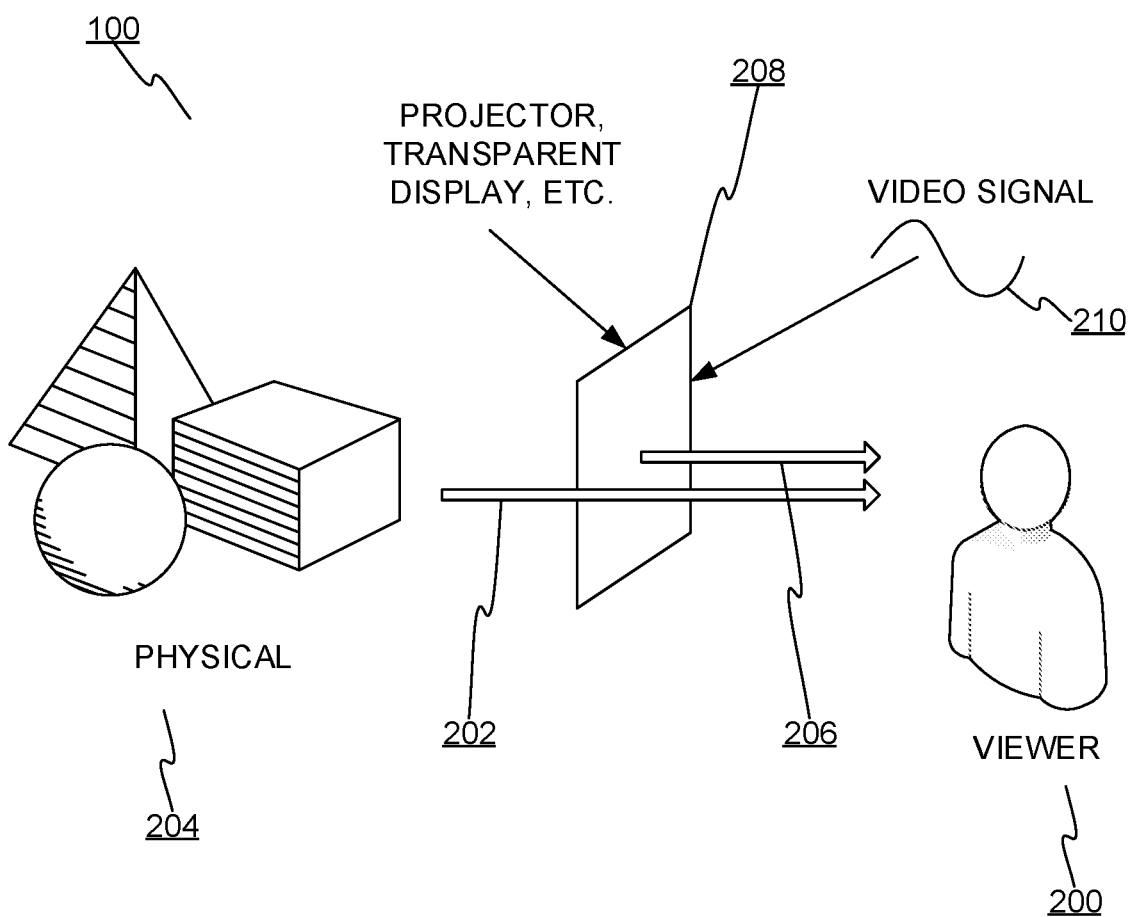
FIG. 6 shows a mixed reality presentation where the eyes of a viewer or user 200 receive a mixture of (i) real-world light reflected from a physical scene and (ii) computer rendered light.
Figure 7:
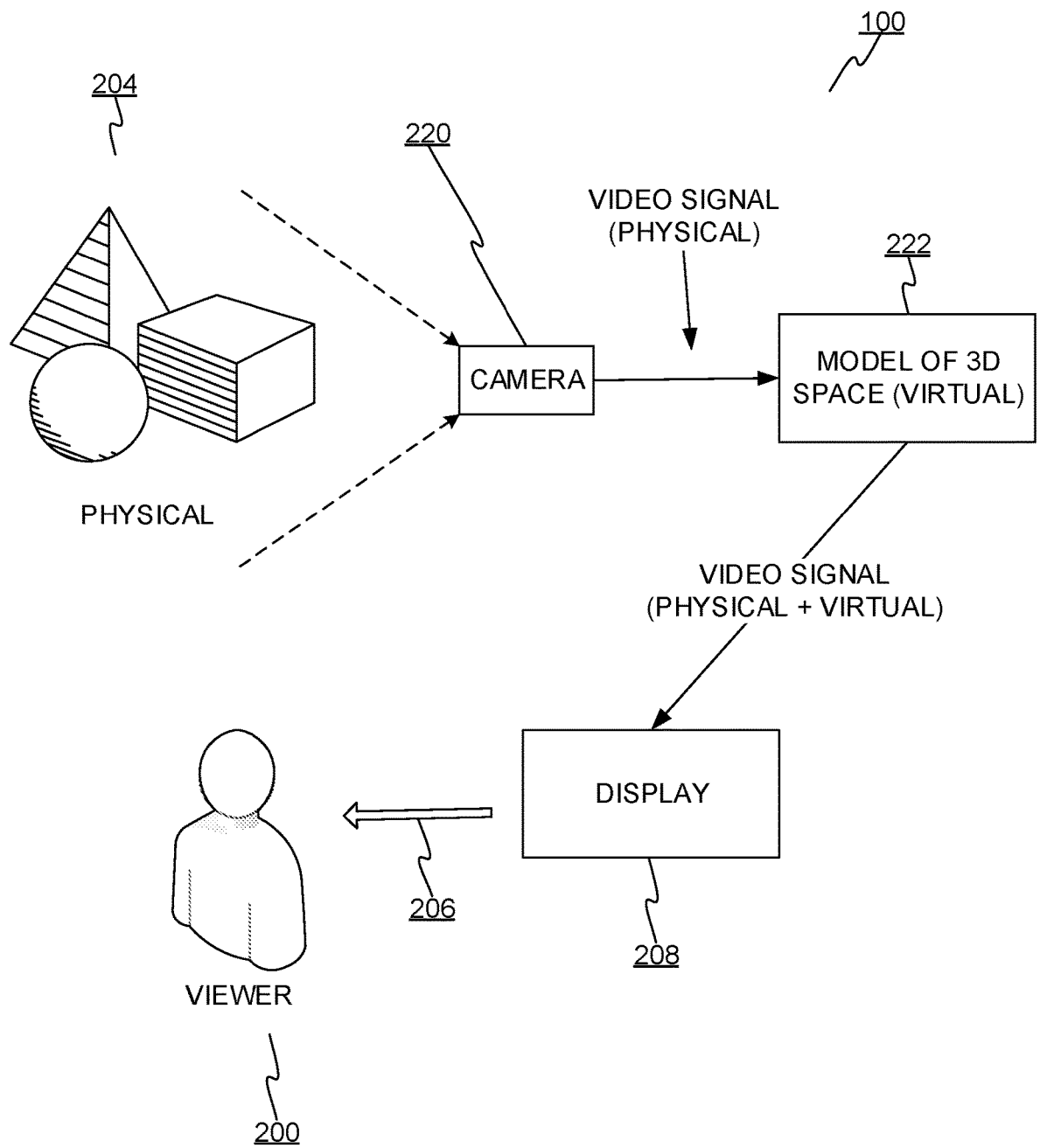
FIG. 7 shows a mixed reality configuration where the eyes of a user perceive the mixed reality as primarily computer rendered light.
Figure 8:
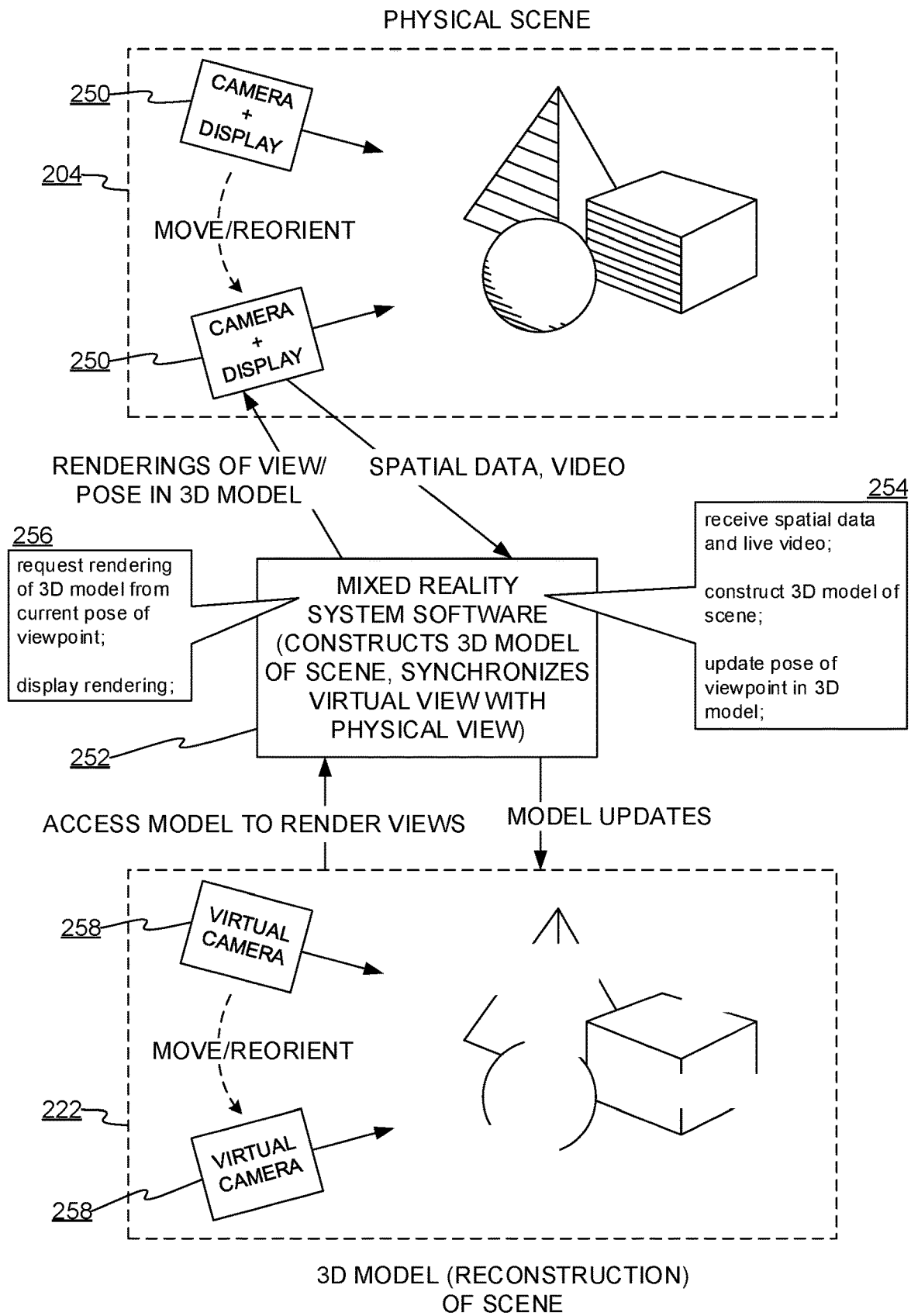
FIG. 8 shows how a mixed reality system builds a spatial three-dimensional model of a physical scene and renders views of the three-dimensional model that correspond to the pose of a camera relative to the physical scene.

FIGS. 6-8 show types of mixed reality systems 100 to which embodiments described herein may be applied. The term "mixed reality" as used herein refers to enhancing real-time video with computer generated graphics (FIG. 6) and augmenting a direct view of reality with computer generated graphics (FIG. 7).

FIG. 6 shows a mixed reality presentation where the eyes of a viewer or user 200 receive a mixture of (i) real-world light 102 reflected from a physical scene 204 and (ii) computer rendered light 206. That is, the user perceives the mixed reality as a composition of computer-generated light and real-world light. The real-world light 202 is light from an ambient source (artificial or natural light) that has reflected from the physical space 204 and passes as such to the eyes of the user 200; the real-world light is not computer rendered light, and may pass to the eye directly, by reflection, and/or by transmission through transparent or optically transformative material. In contrast, the computer rendered light 206 is emitted by any type display device 108 that converts a video signal 210 generated by a computer into light formed to an image that corresponds to the content of the video signal 210.

The display device 208 may be any type of such signal-to-light converting device. In the type of hybrid physical-virtual reality shown in FIG. 1, the display device 208 may any type of device that allows the real-world light 202 and the computer rendered light 206 (generated by the display device 208) to both fall on the eyes of the user 200 at the same time, thus forming a composite physical-virtual image on the retinas of the user 200. The display device 208 might be a transparent or semi-transparent device ("transparent" as used hereafter will also refer to "semi-transparent") that can both generate the computer rendered light 106 and allow the real-world light 202 to pass through it (often referred to as a "heads-up" display). The display device 208 in the case of FIG. 1 might be a small video projector mounted on goggles or glasses that projects its image onto transparent lenses of the goggles or glasses (a head mounted heads-up display). The display device 108 may be a projector that projects onto a large transparent surface (a fixed heads-up display). The display device 208 may be a small projector that projects directly onto the user's retina without the user of a reflective surface. The display device 208 may be a transparent volumetric display or three-dimensional (3D) projection. Any type of device that can render a video signal 210 into visible light and can also permit composition of such light with physical world light will be suitable for the type of mixed reality shown in FIG. 6.

FIG. 7 shows a mixed reality configuration where the eyes of the user 200 perceive the mixed reality as primarily computer rendered light 206. The computer rendered light 206 comprises rendered video whose frames include (i) real world image data of the physical scene 204 as captured by a camera 220, and (ii) virtual image data generated by a computer. The virtual image data is generated and rendered by a computer, for example from a 3D model 222 approximating the geometry (and perhaps other features) of the physical scene 204, a two-dimensional (2D) model (e.g. a windowing desktop), or other virtual space under the interactive control of the user 200. The 3D model 222 may be a reconstruction of the physical scene 204 by applying known image processing algorithms to the signal from the camera 220 possibly in combination with concurrent information about the pose of the camera. The mixed reality system of FIG. 1 may also reconstruct a 3D model from its video stream.

In the type of mixed reality shown in FIG. 7, the user 200 sees a full computer-rendered image, but the image seen by the view includes both artificially generated graphic data as well as image data provided by the camera 220. Note that the video signal from camera 220 may be either a pre-recorded signal or a real-time signal. The mixed reality view is presented by the display device 208, which may be a flat-panel display, a touch-sensitive display surface, a projector, a volumetric display, a head-mounted display (e.g., virtual reality (VR) goggles), or any other technology used to produce full-frame renderings of video produced by a computing device.

The mixed reality systems shown in FIGS. 6 and 7 may be constructed so that the camera and display 208 are both part of a rigid body mixed reality device, for instance a wearable or mobile device. Such a mixed reality device may also have known hardware systems for tracking and reporting changes in the device's relative physical location and orientation (pose), implicitly including the camera and/or display. Position and orientation can additionally or alternatively be inferred from video analysis. A stream of pose updates can be used to synchronize the physical scene 204 being captured by the camera 220 with the spatial 3D model 222 of the physical scene.

FIG. 8 shows how a mixed reality system 250 builds the spatial 3D model 222 of the physical scene and renders views of the 3D model 222 that correspond to the pose of the camera relative to the physical scene 204. As noted above, the mixed reality system 250 may include the camera and display, as well as a pose detection mechanism (gyroscopes, video analysis, radio triangulation, etc.). Mixed reality software 252, running on (or communicating with) the mixed reality system 250 performs two main functions 254, 256.

First function 254 receives the spatial (pose) data of the camera and/or display at the physical scene 204. It uses this information, in known ways, to construct the 3D model of the physical scene. Roughly, the first function 254 recognizes features such as textures, lines, planes, surfaces, feature points, etc., adds representations of such features into the 3D model, using the corresponding spatial pose of the camera to determine where the features belong in the 3D model. In effect, the 3D model is anchored to the physical scene. Moreover, points or objects added to the 3D model by software are effectively anchored to a corresponding fixed location and orientation in the physical scene 204. Such functionality can be performed with known tools such as the ARKit™ published by Apple Inc., the ARCore platform published by Google Inc., toolkits available on Visual Studio™ published by Microsoft Inc., and others. The first function 254 also maintains a virtual camera 258 (i.e., view or viewpoint) whose pose in the 3D model 222 mirrors the pose of the camera/display in the physical scene 204.

The second function 256 renders graphics based of the 3D model and the pose of the virtual camera 258. A rendered view of the 3D model from the current pose of the virtual camera 258 will mirror the physical view "seen" by the camera/display. Moreover, because any 3D objects, points, lines, etc. added to the 3D model by software are effectively anchored to the physical scene by the time-space synchronization between the camera/display and the virtual camera 258, renderings of such 3D objects relative to the user's real-time view of the physical scene will continually have a location, size, orientation, and perspective on the display that stays consistent with the real-time view of the physical scene seen on or through the display. The mixed reality system may at times be maintaining the 3D model without displaying any rendering of the 3D model.

While the mixed reality systems describe above use a reconstructed 3D model for rendering, in other embodiments, a mixed reality system may render graphics combined/overlaid with the physical scene, but without using a 3D model of the physical scene.

Figure 9:
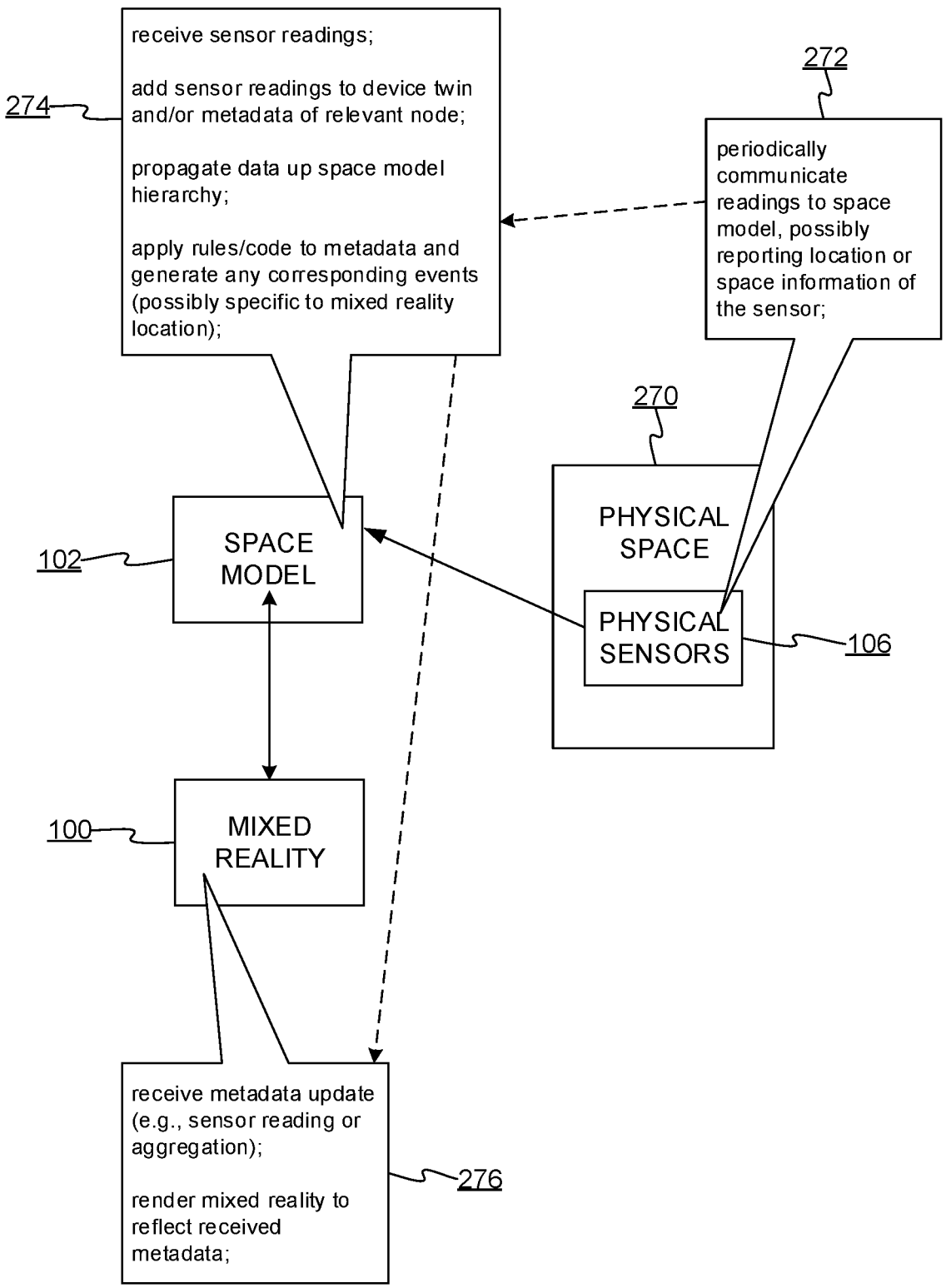
FIG. 9 shows an embodiment for rendering a mixed reality view based on a space model that models information from physical sensors in a physical space modeled by the space model.

FIG. 9 shows an embodiment for rendering a mixed reality view based on a space model that models information from physical sensors 106 in a physical space modeled by the space model. The mixed reality system includes a three-dimensional model (virtual space), which includes three-dimensional models of objects, with the objects located and oriented in the virtual space. In some embodiments, the virtual space is a reconstruction of the surroundings of the mobile/personal mixed reality equipment (camera, display, etc.) employed by a user. The reconstruction is derived by analysis of video from the camera. The reconstruction may be oriented and aligned to match the physical surroundings of the user, thus allowing graphics to be displayed and kept in alignment with the physical surroundings even as the mixed reality equipment is rotated and translated by the user.

Generally, the physical sensor reports a measure, the space model incorporates that measure, and the mixed reality system renders a view according to the measure in the space model. This continuing flow of information from sensor to space model to mixed reality system allows the mixed reality system to render views of the physical space that reflect state of the physical space measured by the sensors.

This general flow of information may begin with the physical sensor performing a process 272 of periodically capturing a sensor value and passing it to the space model, possibly by communicating with a cloud service (or cloud-edge infrastructure). The space model performs a process 274 which includes receiving a sensor reading from the physical sensor, adding the sensor reading to the device representation in the space hierarchy, possibly propagating the sensor reading up the space hierarchy. When a node is updated according to the sensor reading, rules/code in that node may be triggered to evaluate the node's metadata, including possibly a value that depends on the sensor reading. The rules/code may generate an event that is received by the mixed reality system via the metadata service, possibly exchanged through a cloud service. This approach can be useful for enabling updates to the mixed reality system only when sensor measures change by a threshold amount. For instance, consider a temperature value in a node heading a branch of the space hierarchy reach that includes a temperature sensor representation in the branch. When the temperature value of the node (possibly an aggregation of temperature measures in the branch) reaches a threshold the node generates an event with its temperature value.

For its part, the mixed reality system performs a process 276 of receiving the aforementioned sensor updates/values (in the form of node metadata) from the space model. The mixed reality system may incorporate the space model information in various ways. A new model may be added to its three-dimensional model and rendered in the current view (which might be a view of a physical space containing the relevant physical sensor). New textures may be used. Shading or lighting may be altered, and so forth. Of note is the ability to graphically inform the user of the mixed reality system of the sensed state of the physical space within the purview of the mixed reality system.

Figure 10:
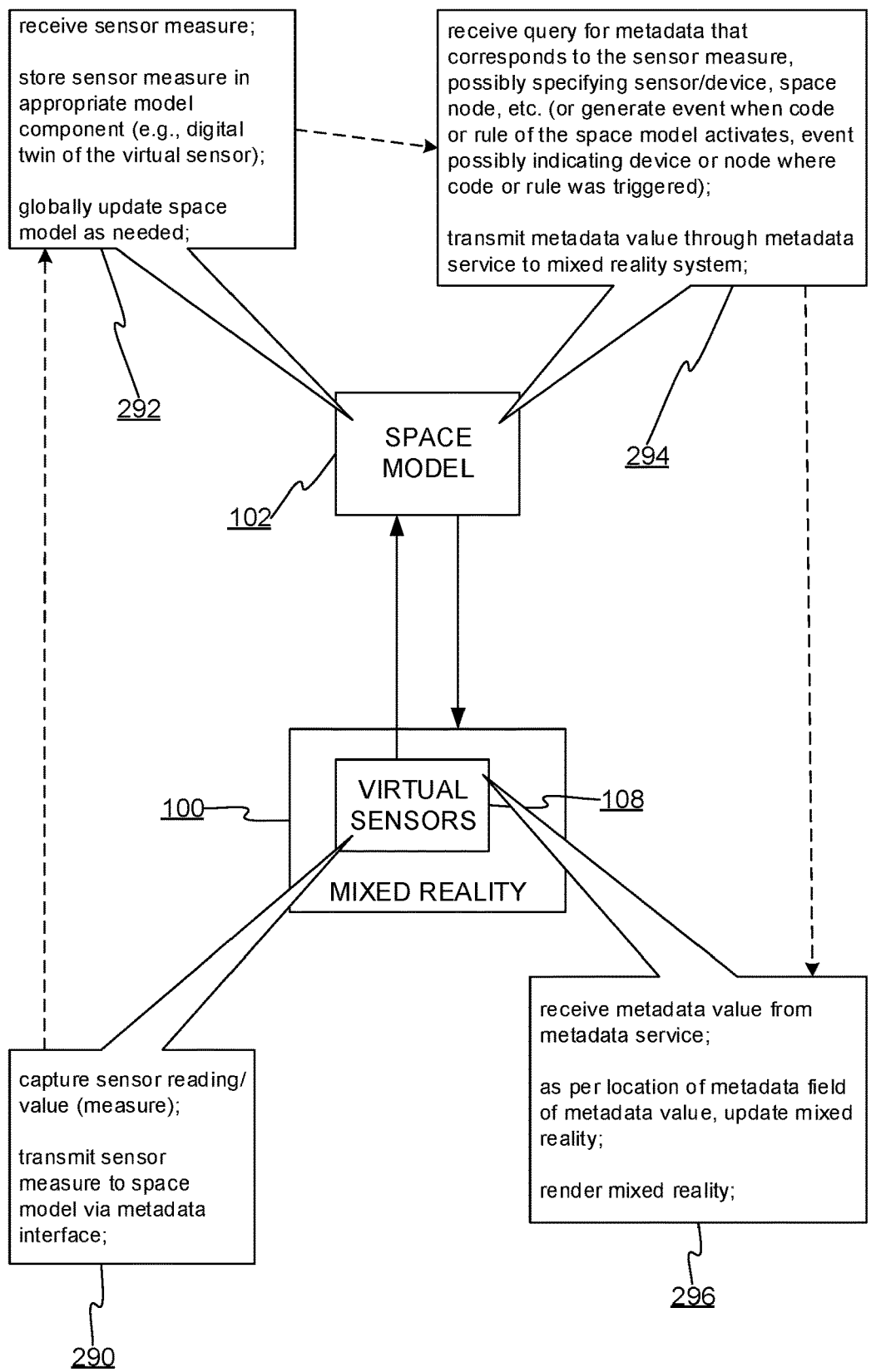
FIG. 10 shows an embodiment for rendering a mixed reality view based on a space model that models information from virtual sensors in a virtual space modeled by the mixed reality system.

FIG. 10 shows an embodiment for rendering a mixed reality view based on a space model that models information from virtual sensors 108 in a virtual space modeled by the mixed reality system 100. As noted above, the mixed reality system includes a three-dimensional model (virtual space), which includes three-dimensional models of objects, with the objects located and oriented in the virtual space. In some embodiments, the virtual space is a reconstruction of the surroundings of the mobile/personal mixed reality equipment (camera, display, etc.) employed by a user, and the reconstruction is oriented and aligned to match the physical surroundings of the user, thus allowing graphics to be displayed and kept in alignment with the physical surroundings even as the mixed reality equipment is rotated and translated by the user.

A continuing cycle of exchange between the mixed reality system and the space model may include a process 290, by which a virtual sensor 108 provides output to the space model 102. The virtual sensor 108 is located and oriented in the virtual space and is possibly rendered by the mixed reality system. If the virtual sensor 108 is interactive, the user can interact with (e.g., actuate) the virtual sensor using the mixed reality user equipment. In practice, the virtual sensor is an agent or object in the mixed reality system which outputs values (virtual measurements, user activations, etc.). In one embodiment, the mixed reality system is itself a virtual sensor within the space hierarchy and the user interacting with it can affect the graphics being displayed. If multiple users are in a room with mixed reality devices, their graphic views of each other can be affected by the position of the mixed reality device relative to the room, for example. In any case, values by the virtual sensor are transmitted to the interface or digital representation of the virtual sensor 108 that exists in the space model, possibly intermediated by the cloud and/or the metadata service.

The space model performs a process 292, which includes receiving the measures or other values from the virtual sensor 108. Regardless of how the virtual sensor data flows into the space model, the virtual sensor data flows into a space element of the space hierarchy to which the virtual sensor has been assigned. If the space model models a building, the virtual sensor may be associated with a room node in the hierarchy, and the room node receives the data associated with the virtual sensor. The virtual sensor data is then available for all of the space model features discussed above. For instance, the virtual sensor data may be included in an aggregation of a node higher up the hierarchy, the virtual sensor data may trigger rules or user code in nodes of the hierarchy, etc.

The space model also performs a process 294 for outputting metadata that reflects its state as possibly updated based on the data from the virtual sensor. As noted above, the space model either generates an event internally and publishes or pushes metadata to the mixed reality system, or the mixed reality system pulls or queries metadata from the space model. The metadata that the mixed reality system receives from the space model can be any kind of space metadata discussed above, including aggregated measurement data or other state of the space model. Moreover, the metadata may be provided based on a location of the user within the space hierarchy. In one implementation, either the space model or the mixed reality has information that can map position of the user to nodes in the space hierarchy. Another approach is for nodes in a space hierarchy to include some respective absolute or relative coordinates that the mixed reality system can use to render views. In another embodiment, the space model reports metadata only for nodes that contain virtual sensors, indicating which node metadata corresponds to which virtual sensors.

The mixed reality system performs a process 296 of receiving and using the metadata from the space model. Any of the techniques or effects mentioned above with respect to physical sensor data may be employed by the mixed reality system with respect to virtual sensor data and/or corresponding space model metadata.

To summarize, in the virtual sensor embodiment, the mixed reality system generates synthetic sensor data, which passes through the space model and back, in various forms, to the mixed reality system, which can then modify its virtual space content and render its graphics to reflect the state of the space model as informed by the virtual sensor.

Figure 11:
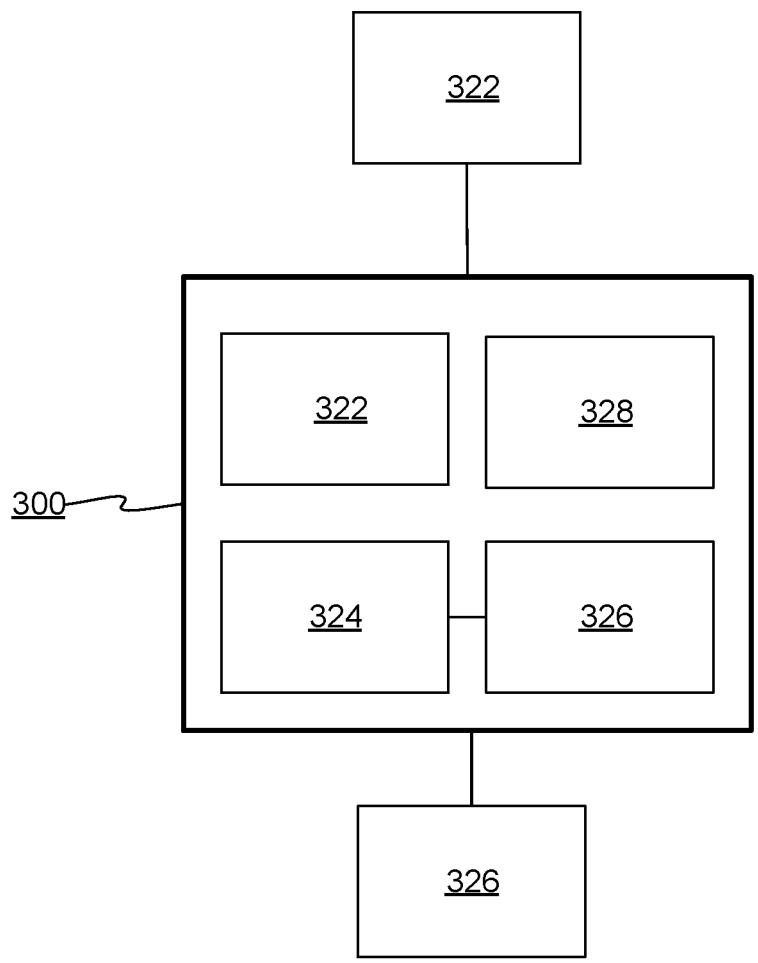
FIG. 11 shows details of a computing device on which embodiments described herein may be implemented.

FIG. 11 shows details of a computing device 300 on which embodiments described above may be implemented. Cloud servers, edge devices, leaf devices, and other devices discussed or implied above may more or less mirror the computing device 300. The technical disclosures herein will suffice for programmers to write software, and/or configure reconfigurable processing hardware (e.g., field-programmable gate arrays (FPGAs)), and/or design application-specific integrated circuits (ASICs), etc., to run on the computing device or host 300 (possibly via cloud APIs) to implement the embodiments described herein.

The computing device or host 300 may have one or more displays 322, a network interface 324 (or several), as well as storage hardware 326 and processing hardware 328, which may be a combination of any one or more of: central processing units, graphics processing units, analog-to-digital converters, bus chips, FPGAs, ASICs, Application-specific Standard Products (ASSPs), or Complex Programmable Logic Devices (CPLDs), etc. The storage hardware 326 may be any combination of magnetic storage, static memory, volatile memory, non-volatile memory, optically or magnetically readable matter, etc. The meaning of the term "storage", as used herein does not refer to signals or energy per se, but rather refers to physical apparatuses and states of matter. The hardware elements of the computing device or host 300 may cooperate in ways well understood in the art of machine computing. In addition, input devices may be integrated with or in communication with the computing device or host 300. The computing device or host 300 may have any form-factor or may be used in any type of encompassing device. The computing device or host 300 may be in the form of a handheld device such as a smartphone, a tablet computer, a gaming device, a server, a rack-mounted or backplaned computer-on-a-board, a system-on-a-chip, or others.

Embodiments and features discussed above can be realized in the form of information stored in volatile or non-volatile computer or device readable storage hardware. This is deemed to include at least hardware such as optical storage (e.g., compact-disk read-only memory (CD-ROM)), magnetic media, flash read-only memory (ROM), or any means of storing digital information in to be readily available for the processing hardware 328. The stored information can be in the form of machine executable instructions (e.g., compiled executable binary code), source code, byte-code, or any other information that can be used to enable or configure computing devices to perform the various embodiments discussed above. This is also considered to include at least volatile memory such as random-access memory (RAM) and/or virtual memory storing information such as central processing unit (CPU) instructions during execution of a program carrying out an embodiment, as well as non-volatile media storing information that allows a program or executable to be loaded and executed. The embodiments and features can be performed on any type of computing device, including portable devices, workstations, servers, mobile wireless devices, and so on.

The invention claimed is:

1. A method performed by one or more computing devices, the method comprising:

providing a mixed reality system, the mixed reality system comprising a display, a camera, a three-dimensional model, and a processor, the mixed reality system rendering graphics on the display according to the three-dimensional model and orientations of the camera and/or the display, the camera capturing video data of a physical space;

providing a space model that models the physical space, the space model comprising a space hierarchy, the space hierarchy comprising space nodes structured as a tree, each node comprising respective node metadata and representing a respective part of the physical space, one or more of the nodes comprising rules or code that operate on the metadata, each node comprising a respective node type that corresponds to a type of physical space, wherein metadata of some nodes comprise aggregations of metadata from child nodes in the space hierarchy, some of the nodes further comprising device representations that represent physical and/or virtual sensors associated therewith;

receiving, by the space model, sensor readings from the physical and/or virtual sensors, updating the node metadata accordingly, and applying the rules or code to the updated node metadata to determine to generate an event corresponding to the updated node metadata, and based thereon sending the event to the mixed reality system; and receiving, by the mixed reality system, the event from the space model, and rendering, on the display, a view of the three-dimensional model, the rendering the view comprising modifying graphics representing the three-dimensional model to include graphics representing the event.

2. The method according to claim 1, wherein the updated node metadata received by the mixed reality system comprises an identifier of a node in the space hierarchy, the method further comprising, according to the identifier, correlating the updated node metadata received by the mixed reality system with the three-dimensional model, wherein the updating of the three-dimensional model is performed according to the correlating.

3. The method according to claim 1, wherein the rendering provides a user of the mixed reality system with visual feedback about the physical and/or virtual sensors.

4. The method according to claim 1, wherein the readings are from physical sensors, wherein the physical sensors are located in physical spaces that correspond to respective nodes in the space hierarchy that comprise representations of the physical sensors.

5. The method according to claim 4, wherein the rendering comprises generating graphics that represent measurements from the physical sensors.

6. The method according to claim 5, wherein a cloud comprises a cloud service, the cloud service provides the space model.

7. The method according to claim 6, wherein the cloud further comprises a metadata service, the method further comprising querying the metadata service by the mixed reality system and receiving the node metadata from the metadata service in response.

8. The method according to claim 1, wherein the readings are from virtual sensors, wherein the virtual sensors are represented by respective objects in the three-dimensional model of the mixed reality system, wherein the virtual sensors are also represented in the space model, the method further comprising outputting a sensor reading from a virtual sensor to the mixed reality system, and rendering a view of the mixed reality system that includes a graphic representation of the virtual sensor and graphics determined according to node metadata from the space model that corresponds to the sensor reading from the virtual sensor.

9. The method performed by one or more computing devices comprising processing hardware and storage hardware, the storage hardware storing instructions configured to, when executed by the processing hardware, perform the method, the method comprising:
providing a space model accessible via a data network, the space model comprising a data structure comprising space nodes representing respective spaces, the space nodes organized as a tree with hierarchical structure corresponding to hierarchical structure of a physical space, some of the space nodes comprising device representations, each device representation comprising state of a respective virtual or physical device that is updated by a corresponding physical or virtual device, wherein the state of each device representation is updated to include measures from respective virtual and/or physical sensors;
providing a mixed reality system comprising a camera and a three-dimensional model, the mixed reality system rendering views of the three-dimensional model according to locations and orientations of the camera, the mixed reality system interfacing with a service to access the space model;
receiving, by the mixed reality system, from the space model via the service, sensor metadata obtained from within the space model by the service, the sensor metadata provided by the space model and comprising or derived from the measures of the virtual and/or physical sensors; and rendering, by the mixed reality system, views of the three-dimensional model according to locations and orientations of the camera and according to the sensor metadata received from the space model, wherein the mixed reality system renders the three-dimensional model to include graphics representing the sensor metadata received from the space model.

10. The method according to claim 9, further comprising maintaining information that correlates some of the space nodes with locations in the three-dimensional space of the mixed reality system and based thereon correlating the sensor metadata with a location in the three-dimensional space.

11. The method according to claim 9, wherein the mixed reality system aligns a view of the three-dimensional model with a physical space being captured by the camera, and wherein graphics generated for the view are generated according to the sensor metadata.

12. The method according to claim 9, wherein the sensor metadata comprises or is derived from a virtual sensor in the mixed reality system.

13. The method according to claim 12, wherein the three-dimensional model includes a model of the virtual sensor, and a view of the three-dimensional model rendered by the mixed reality system includes the model of the virtual sensor, whereby graphics for the view include graphics portraying the virtual sensor.

14. The method according to claim 13, wherein the mixed reality system responds to user inputs directed to the graphics portraying the virtual sensor by generating a new measure that is provided to the space model and that is stored in a device representation of the virtual sensor.

15. A computer-readable storage hardware storing information configured to cause one or more computing devices to perform a process, the process comprising:
managing a space model that models the containment relationships among places in a physical space, wherein some physical places contain other physical places and the space model includes place nodes and links therebetween that reflect the containment relationships, the links and place nodes comprising a tree hierarchy corresponding to the hierarchical containment relationships between the physical places, some nodes comprising representations of physical sensors in respective physical places, wherein each physical sensor in a physical place has a respective representation in a place node corresponding to the physical place, and wherein each representation stores a measure from its respectively represented physical sensor;
establishing a communication link between the space model and a mixed reality system;
receiving, by the mixed reality system, via the communication link, sensor values comprising or derived from the measures in the representations; and
rendering, by the mixed reality system, according to the sensor values, graphics of a three-dimensional model of at least part of the physical place, wherein some of the graphics represent the sensor values.

16. The computer-readable storage hardware according to claim 15, wherein some of the nodes comprise respective user code and/or user rules, the user code and/or user rules evaluating state of the space model and generating events when the state satisfies conditions in the user code and/or the user rules, the events conveying the sensor values to the mixed reality system.

17. The computer-readable storage hardware according to claim 15, the process further comprising receiving a metadata query from the mixed reality system by the space model and obtaining a sensor value from the space model according to the metadata query.

18. The computer-readable storage hardware according to claim 15, wherein the obtained sensor value is obtained from a parent node having child nodes with corresponding device representations, and wherein the obtained sensor value comprises an aggregation of measures from the child device representations.

19. The computer-readable storage hardware according to claim 15, wherein the physical sensors comprise Internet of Thing (IoT) sensors in communication with a cloud service.

20. The computer-readable storage hardware according to claim 19, wherein the mixed reality system provides a user thereof with visual feedback of the measures from the IoT sensors.

\* \* \* \* \*